United States Patent
Wijetunga et al.

(10) Patent No.: US 7,023,243 B2
(45) Date of Patent: Apr. 4, 2006

(54) CURRENT SOURCE EVALUATION SENSE-AMPLIFIER

(75) Inventors: Panduka Wijetunga, Los Angeles, CA (US); Anthony Levi, Los Angeles, CA (US)

(73) Assignee: University of Southern California, Los Angeles, CA (US)

(*) Notice: Subject to any disclaimer, the term of this patent is extended or adjusted under 35 U.S.C. 154(b) by 43 days.

(21) Appl. No.: 10/397,452

(22) Filed: Mar. 26, 2003

(65) Prior Publication Data

US 2003/0210078 A1 Nov. 13, 2003

Related U.S. Application Data

(60) Provisional application No. 60/378,838, filed on May 8, 2002.

(51) Int. Cl.
*G01R 19/00* (2006.01)

(52) U.S. Cl. .......................... 327/57; 327/55
(58) Field of Classification Search ............. 327/65–67, 327/52–57, 210–215
See application file for complete search history.

(56) References Cited

U.S. PATENT DOCUMENTS

| | | | |
|---|---|---|---|
| 3,562,554 A | 2/1971 | Von Feldt | |
| 3,648,071 A | 3/1972 | Mrazek | |
| 3,694,763 A | 9/1972 | Hart, Jr. et al. | |
| 3,838,295 A | 9/1974 | Lindell | |
| 3,838,404 A | 9/1974 | Heeren | |
| 3,879,621 A | 4/1975 | Cavaliere et al. | |
| 3,949,381 A | 4/1976 | Dennard et al. | |
| 3,983,412 A | 9/1976 | Roberts et al. | |
| 4,003,034 A | 1/1977 | Au | |
| 4,010,453 A | 3/1977 | Lewis | |
| 4,031,524 A | 6/1977 | Heeren | |
| 4,132,904 A | 1/1979 | Harari | |
| 5,436,866 A | 7/1995 | Jang | |
| 5,444,398 A | 8/1995 | Kiehl et al. | |
| 5,457,657 A | 10/1995 | Suh | |
| 5,471,160 A | 11/1995 | Higaki | |
| 5,506,524 A | 4/1996 | Lin | |
| 5,847,598 A * | 12/1998 | Sone | 327/563 |
| 5,939,903 A | 8/1999 | Lin | |
| 6,005,816 A * | 12/1999 | Manning et al. | 365/208 |
| 6,137,319 A | 10/2000 | Krishnamurthy et al. | |
| 6,333,673 B1 * | 12/2001 | Dawes | 330/9 |
| 6,404,266 B1 * | 6/2002 | Chen | 327/478 |
| 6,590,805 B1 * | 7/2003 | Lu et al. | 365/158 |
| 2001/0002110 A1 | 5/2001 | Forbes et al. | |
| 2001/0002178 A1 | 5/2001 | Wayayama et al. | |
| 2001/0002886 A1 | 6/2001 | Ooishi | |
| 2001/0004334 A1 | 6/2001 | Feurle | |
| 2001/0005150 A1 | 6/2001 | Eum | |
| 2001/0012228 A1 | 8/2001 | Perner | |

(Continued)

OTHER PUBLICATIONS

Itoh, K., Trends in Low-Power RAM Circuit Technologies, Proceedings of the IEEE, vol. 83, No. 4, Apr. 1995, pp. 524-543.

(Continued)

*Primary Examiner*—Kenneth B. Wells
(74) *Attorney, Agent, or Firm*—McDermott Will & Emery LLP

(57) ABSTRACT

A sense-amplifier based on current-source-evaluation. Compared to conventional sense-amplifiers, a design based on static-current sources scales better to small transistor geometries. The design has lower power consumption, reduced noise, and improved clock scaling.

2 Claims, 6 Drawing Sheets

U.S. PATENT DOCUMENTS

| | | |
|---|---|---|
| 2001/0022738 A1 | 9/2001 | Choi |
| 2001/0024381 A1 | 9/2001 | Fuchigami et al. |
| 2001/0024395 A1 | 9/2001 | Sim |
| 2001/0026490 A1 | 10/2001 | Nakagawa |
| 2001/0028586 A1 | 10/2001 | Mullarkey et al. |
| 2001/0033184 A1 | 10/2001 | Terzioglu et al. |
| 2001/0038562 A1 | 11/2001 | Rohr et al. |
| 2001/0038564 A1 | 11/2001 | Verbeck |
| 2001/0043089 A1 | 11/2001 | Forbes et al. |
| 2001/0046149 A1 | 11/2001 | Hidaka |
| 2001/0048620 A1 | 12/2001 | Fischer et al. |
| 2001/0052801 A1 | 12/2001 | Zhang |
| 2002/0000838 A1 | 1/2002 | Brachmann et al. |
| 2002/0000839 A1 | 1/2002 | Mueller et al. |
| 2002/0000840 A1 | 1/2002 | Conte et al. |
| 2002/0000841 A1 | 1/2002 | Rai et al. |
| 2002/0000859 A1 | 1/2002 | Dai et al. |
| 2002/0000860 A1 | 1/2002 | Dai |
| 2002/0003734 A1 | 1/2002 | Kim et al. |
| 2002/0004267 A1 | 1/2002 | Sudo et al. |
| 2002/0006050 A1 | 1/2002 | Jain |
| 2002/0008549 A1 | 1/2002 | Forbes |
| 2002/0008550 A1 | 1/2002 | Sim et al. |
| 2002/0011876 A1 | 1/2002 | Shin |
| 2002/0015324 A1 | 2/2002 | Maruyama |
| 2002/0017927 A1 | 2/2002 | Sugio |
| 2002/0018372 A1 | 2/2002 | Thoma et al. |
| 2002/0021147 A1 | 2/2002 | Lim et al. |
| 2002/0024863 A1 | 2/2002 | Forbes |
| 2002/0030514 A1 | 3/2002 | Bailey et al. |
| 2002/0033723 A1 | 3/2002 | Lee et al. |
| 2002/0039309 A1 | 4/2002 | Lu et al. |
| 2002/0041521 A1 | 4/2002 | Park |

OTHER PUBLICATIONS

Montanaro, J., A 160-MHz, 32-b, 0.5-W CMOS RISC Microprocessor, IEEE Journal of Solid-State Circuits, vol. 31, No. 11, Nov. 1996, pp. 1703-1714.

Klass, F., Semi-Dynamic and Dynamic Flip-Flops with Embedded Logic, 1998 Symposium on VLSI Circuits Digest of Technical Papers, pp. 108-109.

Kim, J., Sense Amplifier-Based Flip-flop with Two N-$C^2$MOS Output Latches, Electronic Letters, Mar. 16, 2002, vol. 36, No. 6, pp. 498-500.

Kristovski, G., New Sense Amplifier for Small-Swing CMOS Logic Circuits, IEEE Transactions on Circuits and Systems-II: Analog and Digital Signal Processing, vol. 47, No. 6, Jun. 2000, pp. 573-576.

Nikolic, B., Improved Sense-Amplifier-Based Flip-Flop: Design and Measurements, IEEE Journal of Solid-State Circuits, vol. 35, No. 6, Jun. 2000, pp. 876-884.

Khellah, M., A Low-Power High-Performance Current-Mode Multiport SRAM, IEEE Transactions on Very Large Scale Integration (VLSI) Systems, vol. 9, No. 5, Oct. 2001, pp. 590-598.

Kuang, J., A Tri-State Body Charge Modulated SOI Sense Amplifier, 2001 IEEE International SOI Conference, Oct. 2001, pp. 135-136.

Laurent, D., Sense Amplifier Signal Margins and Process Sensitivities, IEEE Transactions on Circuits and Systems-I: Fundamental Theory and Applications, vol. 49, No. 3, Mar. 2002, pates 269-275.

WIPO, International Searching Authority. International Search Report, mailed Oct. 27, 2003.

* cited by examiner

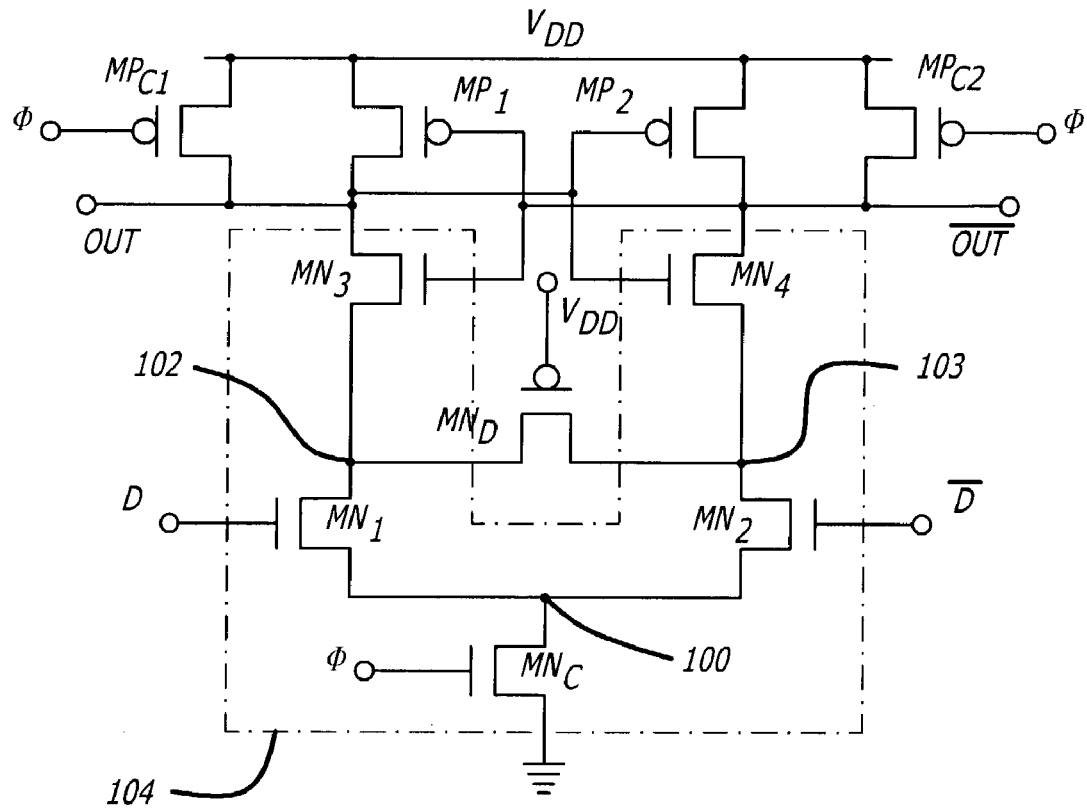
FIG. 1 *(Prior Art)*
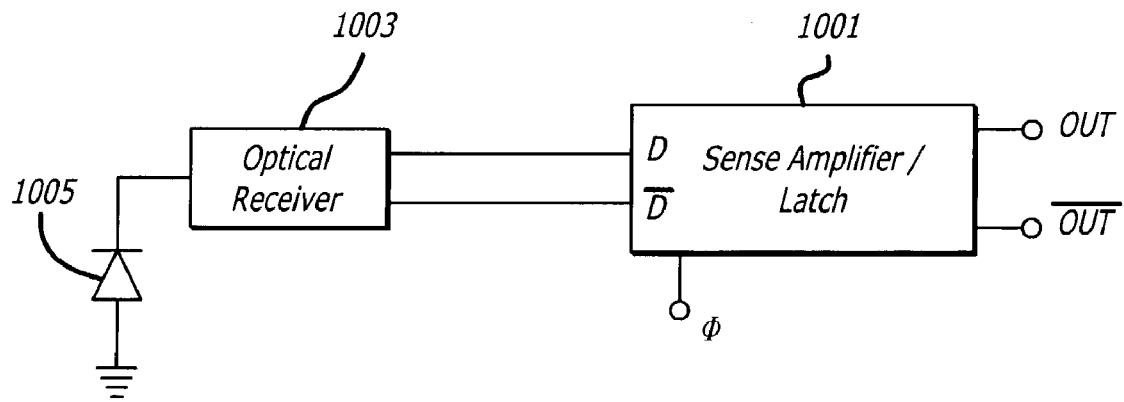
FIG. 10

FIG. 2A *(Prior Art)*
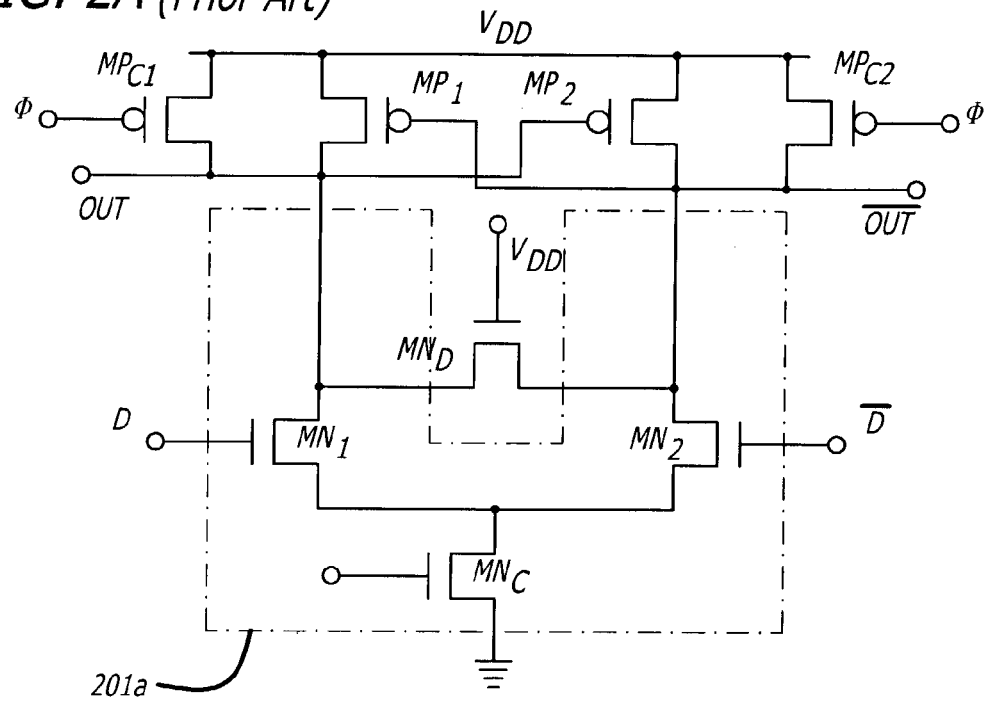
FIG. 2B *(Prior Art)*
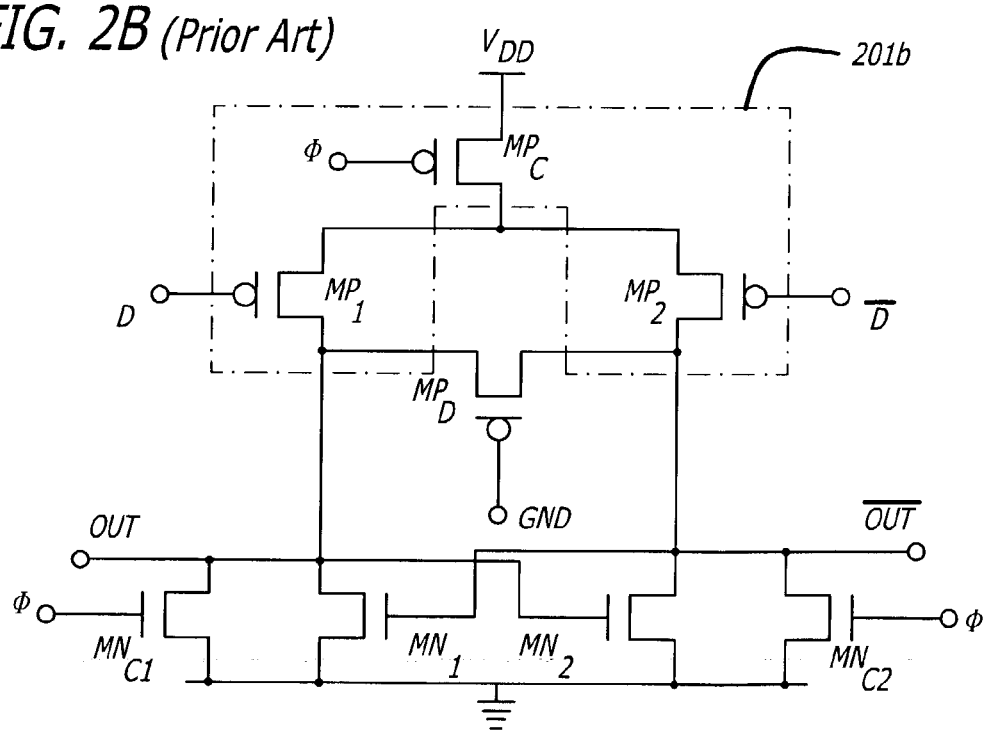

CURRENT SOURCE EVALUATION SENSE-AMPLIFIER

CROSS REFERENCE TO RELATED APPLICATION

This application claims priority to U.S. provisional application, Ser. No. 60/378,838, filed on May 8, 2002, entitled "High Speed Sense Amplifier," the entire content of which is incorporated herein by reference.

STATEMENT REGARDING FEDERALLY SPONSORED RESEARCH OR DEVELOPMENT

This invention was made with government support under Contract Nos. DARPA 04UJ-TC-981410 and DARPA 04UJ-TC9A1410, awarded by the United States Government. The government has certain rights in the invention.

BACKGROUND

1. Field

This invention relates to sense amplifiers and, in one embodiment, sense amplifiers for deep sub-micron designs.

2. Description of Related Art

A. Overview

Sense amplifiers ("SAs") were traditionally used in dynamic and static (cache, buffers, etc.) random access memory (RAM) to improve memory-access latency. Due to increasing clock speeds of digital logic circuits and increasing on-chip interconnect parasitics, SAs have also gained popularity in modern digital logic circuit designs. In static and dynamic memory, SAs are used to improve the read-access time. In digital logic, SAs are used to improve the performance of flip-flops ("FFs"), the most commonly used digital building block.

Flip-flops are an integral part of digital design because of their use in retime, deskew and receive circuitry. Previous work on flip-flops included efforts at utilizing SA front-ends to improve sensitivity and speed of conventional flip-flops. The basic SA flip-flop ("SAFF") circuit contains an SA front-end followed by a latch stage.

Previous work on high-performance SAFFs has concentrated on improving the latch stage and has mostly ignored the SA front-end. The SAFF reported in J. Montanaro, R. T. Witek, et al., "A 160 MHz, 32-b 0.5 W CMOS RISC microprocessor," IEEE J. Solid-State Circuits, vol. 31, pp. 1703–1714(November 1996), uses a NAND set reset (SR) latch; H. Partovi, R. Burd, et al., "Flow-through latch and edge-triggered flip-flop hybrid elements," ISSCC Dig. Tech. Papers, pp 138–139 (1996), uses a hybrid-latch flip-flop; a semi-dynamic flip-flop in F. Klass, "Semi-dynamic and dynamic flip-flops with embedded logic," Symp. VLSI Circuits Dig. Tech Papers, pp. 108–109 (1998), uses dynamic-style flip-flops; B. Nikolic, V. Oklobdzija, V. Stohanovic, W. Jia, "Improved sense-amplifier-based flip-flop: Design and measurements," IEEE J. of Solid-State Circuits, pp. 876–884, vol. 35 (June 2000) uses a cross-coupled inverter latch; and J. C. Kim, Y. C. Jang and H. J. Park, "CMOS sense-amplifier-based flip-flop with N-C2MOS output latches," Electronic Letters, vol. 36, pp.498–500 (March 2000), uses a N-C2MOS latch.

Common to all these designs, which are incorporated herein by reference, is a standard sense-amplifier front-end. Each of these types of sense-amplifiers are referred to in this application as a conventional voltage mode sense-amplifier ("CVSA").

Research on SA designs has analyzed the sensitivity of the CVSA design to process variations such as transistor mismatch and has also improved the original design such as in the case of a PMOS cross-coupled SA ("pCCSA"). These approaches to SA design assumed and were optimized for relatively large transistor geometries and higher voltage supply-rails than commonly in use today.

For a higher-voltage supply-rail, it is important to eliminate DC current paths (zero static power consumption) to achieve low power. In both CVSA and pCCSA, this is achieved by including clocked transistors in the evaluation path. Over the years, despite some optimization that has been made to earlier designs, the core architecture of the clocked voltage SA has remained similar to the initial designs with clocked transistors in the evaluation path.

Today, deep sub-micron CMOS technology has relatively low-voltage supply rails. As a consequence, it is important to reduce the evaluation chain depth to improve circuit performance and process scaling. To employ SAs in high-speed designs, they should also be able to achieve a multi-GHz operating frequency without compromising power, sensitivity and clock-load. Unfortunately, conventional voltage sense-amplifier designs carry a high clock-load burden that limits their frequency scaling. The experimental results for earlier SA designs have therefore been limited to sub-GHz operating frequencies. See B. Nikolic, V. Oklobdzija, V. Stohanovic, W. Jia, "Improved sense-amplifier-based flip-flop: Design and measurements," IEEE J. of Solid-State Circuits, pp. 876–884, vol. 35 (June 2000), the content of which is incorporated herein by reference.

To improve scaling of SAs into deep sub-micron designs, it is therefore important to reduce the evaluation chain depth, reduce the noise generated by the SA, and reduce the SA clock-load.

B. Detailed Description of Prior Art CVSA and pCCSA

The operation of a clocked sense-amplifier consists of a pre-charge/discharge phase, also known as an equalization phase, and an evaluation phase. To eliminate DC power consumption, commonly used sense-amplifier architectures have a clocked transistor in the evaluation chain. Two of the most popular SA architectures are the conventional voltage sense amplifier ("CVSA") and pMOS cross-coupled sense-amplifier ("pCCSA"), which is a modified version of the CVSA.

(1) Conventional Voltage Sense Amplifier (CVSA)

FIG. 1 is a schematic of a prior art conventional voltage-mode sense-amplifier (CVSA). The sense-amplifier has a clocked NMOS transistor $MN_C$ in the evaluation path 104 and an evaluation path depth of three. One path is $MN_3$, $MN_1$ and $MN_C$; the other is $MN_4$, $MN_2$ and $MN_C$.

As is well understood by those skilled in the art, $V_{DD}$ is a reference to the supply voltage; $\phi$ is a reference to the clock input, D is a reference to the data input; $\overline{D}$ is a reference to the complement of the data input; OUT is a reference to the data output; $\overline{OUT}$ is a reference to the complement of the data output; the first letter "M" in the labels signifies a transistor; the second letter "P" or "N" specifies that the transistor is a "P" or "N" channel transistor; the "C" subscript specifies that the transistor is managing the clock signal; the "D" subscript specifies that the transistor is managing the data signal; and the subscript number represents an arbitrary number to distinguish each transistor from others of the same type and management function. This same nomenclature is used throughout all of the figures in this application.

During the equalization phase, the clock $\phi$ is low; transistor $MN_C$ is switched off; transistors $MP_{C1}$ and $MP_{C2}$ are switched on; and the nodes OUT and $\overline{\text{OUT}}$ are precharged to $V_{DD}$. The high output keeps transistors $MN_3$ and $MN_4$ switched on. Since there is no current path to ground, the intermediate nodes 102 and 103 are precharged to $V_{DD}-V_{thN}$, where $V_{thN}$ is the threshold voltage of the N transistors.

In addition, node 100 is precharged to $V_{IN\_HIGH}-V_{thN}$, where $V_{IN\_HIGH}$ is the higher of the two voltages at inputs D and $\overline{D}$. The lower limit on the size of transistors $MP_{C1}$ and $MP_{C2}$ is determined by their ability to fully precharge the nodes in half a clock cycle, i.e., in a single clock phase. The precharge speed of the CVSA in FIG. 1 is proportional to the precharge transistor conductivity of $MP_{C1}$ and $MP_{C2}$ and is inversely proportional to the SA load and parasitic capacitance.

At the clock φ goes high, the SA enters the evaluation phase. During the evaluation phase, transistors $MP_{C1}$ and $MP_{C_2}$ are switched off and transistor $MN_C$ is switched on. For small input signals (D−$\overline{D}$=±ΔV), transistors $MN_1$ and $MN_2$ remain switched on and, as a result, there is a current path to ground from both OUT and $\overline{\text{OUT}}$. However, due to the voltage differential between the inputs, one of the paths will sink more current compared with the other. The evaluation path 104 connected to the higher input voltage will have higher current-sinking capability, and the output of that evaluation path will get pulled down to ground.

From the previous description, it will be understood by those skilled in the art that the evaluation speed of the SA in FIG. 1 is proportional to the input voltage differential, the conductivity of the evaluation path, and is inversely proportional to the SA load and parasitic capacitance. The conductivity of the evaluation chain is proportional to the nMOS transistor size, and is inversely proportional to the number of series transistors. As seen in FIG. 1, the CVSA has a 3-transistor deep evaluation path 104.

The pMOS and nMOS transistors can be interchanged in the CVSA design to generate a predischarge sense-amplifier. When the evaluation path is changed to pMOS, the transistor sizes must be increased to compensate for the reduced speed of pMOS (nMOS is typically 3–4 times faster than PMOS). Since the parasitic capacitance of the SA increases as an unfortunate side effect of increased pMOS transistor sizes, the actual increase in the pMOS transistor sizes will be greater than the mobility ratio between nMOS and pMOS.

If the parasitic contribution from the evaluation chain is assumed to remain constant, moving from precharge to predischarge results in 3 times the reduction in the predischarge transistor size. As a result, the capacitive contribution from predischarge transistors to the output node capacitance and clock-load will be reduced by a factor of 3. Unfortunately, since the pMOS evaluation transistors need to be resized to achieve the required evaluation speed, moving from precharge to predischarge would be likely to increase the parasitic capacitance of the evaluation chain by more than 3 times. Therefore, an increase in total clock-load capacitance and SA node capacitance is expected. Thus, the predischarge type CVSA will in general under perform its precharge counterpart.

For slower clock speeds, where the parasitic capacitance of the CVSA is smaller than the load capacitance, transistors can be resized to achieve better performance without significantly increasing the total output node capacitance. As a result, at slower clock speeds there is a linear relationship between the CVSA performance and the clock-load. A CVSA designed in 0.18 μm CMOS technology optimized to operate at 1.0 GHz clock frequency has a clock-load that is 1.8 times greater than a CVSA optimized for a 500 MHz clock frequency.

Hspice simulation results for conventional voltage SAs (CVSA) optimized for different operating frequencies simulated in 0.18 μm CMOS are shown in Table 1. The output load is 10.0 fF and the target input sensitivity is 100 m $V_{PP}$.

TABLE 1

| Optimized operating frequency | Delay (ps) | Clock-load (fF) | RMS Power (μW) |
|---|---|---|---|
| 1.5 GHz | 96 | 10 | 240 |
| 2.0 GHz | 72 | 18 | 410 |
| 2.5 GHz | 63 | 27 | 655 |
| 3.0 GHz | 57 | 39 | 980 |

On the other hand, for frequencies above 1.0 GHz, transistor resizing is of decreasing benefit. This is because the CVSA output parasitic capacitance is comparable to the load capacitance. Resizing to improve CVSA performance also increases the total CVSA capacitance, limiting the overall performance improvement. At a clock frequency of 1.5 GHz, CVSA output parasitic to load capacitance ratio is 0.75. When the transistors are doubled in size, even though the output node capacitance increases by a factor of 1.4, there is still a 1.4 times improvement in the speed. On the other hand, if the transistors are resized by a factor of 4, due to the 2.3 times increase in the output capacitance, there is only a 1.75 times speed improvement. This analysis agrees with the Hspice simulation results given in Table 1. Compared to the 1.5 GHz CVSA, the 3.0 GHz CVSA achieved a 1.7 times improvement in the evaluation delay at the cost of a 4 times increase in the clock-load. Clearly the CVSA has serious performance limitations as clock frequency is increased.

(2) pMOS and nMOS Cross-coupled Sense-amplifiers (pCCSA and nCCSA)

FIG. 2(a) is a schematic of a prior art PMOS cross-coupled SA design. This is a modification to the conventional architecture and does not include a cross-couple transistor pair in the evaluation path 201a. Since both the CVSA design of FIG. 1 and the cross-coupled SA design in FIG. 2(a) share the same basic design, the operation of the two SAs are similar and also have similar drawbacks.

Eliminating the cross-coupled transistors from the evaluation chain reduces the evaluation path depth and the number of parasitic nodes in the SA. In a pCCSA, when the NMOS cross-coupled transistors $MN_3$ and $MN_4$ in FIG. 1 are eliminated from the evaluation path, the PMOS cross-coupled pair $MP_1$ and $MP_2$ need to be resized to compensate. The resulting increased in the pMOS cross-couple pair $MP_1$ and $MP_2$ increases the SA parasitic capacitance and reduces the SA frequency response.

The frequency response of the cross-couple SA can be improved by swapping the pMOS and nMOS transistors, resulting in the prior art nMOS cross-couple sense amplifier (nCCSA) shown in FIG. 2b, with an evaluation path 201b.

Compared with a pMOS cross-couple load, an nMOS cross-couple load is able to provide stronger positive feedback. In addition, since the nCCSA uses nMOS predischarge, compared to the pMOS counterpart, the equalization phase has faster response time and lower capacitance. In addition, the analysis of the clock-load characteristics shows that predischarge architecture also reduces the equalization phase clock-load significantly.

Although there is a significant reduction in equalization clock-load, it does not translate into a significant reduction in the total clock-load. In nCCSA, the clocked PMOS evaluation transistor $MP_C$ dominates the clock-load, and the capacitance contribution of $MP_C$ is 4 times greater than the capacitive contribution of $MN_{C1}$ and $MN_{C2}$ for 3.0 GHz SA in 0.18 μm technology.

SUMMARY

A clocked sense amplifier may have an evaluation path that is not clocked and that includes two substantially matched current sources.

The clocked sense amplifier may include a current mode core that has a transistor stack consisting of no more than one transistor.

The evaluation path may include a pMOS transistor.

The clocked sense may be configured to operate with an equalization phase and an evaluation phase. The equalization phase may include a predischarge phase. An nMOS transistor may be used in the predischarge phase.

The clocked sense amplifier may include an input differential transconductance stage for sensing the input to the amplifier.

The clocked sense amplifier may include an input pass transistor stage.

The clocked sense amplifier may be connected to a current-steering latch.

The clocked sense amplifier may be connected to an nMOS dynamic latch.

The clocked sense amplifier may be connected to a current-steering dynamic latch.

Two of the clocked sense amplifiers may be configured to form a demultiplexer.

The clocked sense amplifier further may include an input and a terminating resistor in communication with the input configured to create a high speed receiver.

Two of the clocked sense amplifiers may be configured to form a multiplexer.

The clocked sense amplifier may include an output and at terminating resistor in communication with the output configured to reduce power supply noise.

The clocked sense amplifier may include an input, an optical receiver in communication with the input, and a photodiode in communication with the optical receiver, configured to create a low power, low noise quantizer.

The clocked sense amplifier may be constructed using sub-micron technology. 0.18 μm or 0.13 technology may be used, as well as other technology, including smaller technologies as they are developed.

The clocked sense amplifier may have an evaluation path that includes a pMOS transistor that is not clocked, a current mode core that has a transistor stack consisting of no more than one transistor, and two substantially matched current sources.

A method of sense amplification is provided that may include an equalization step during a first portion of a clock cycle and an evaluation step during a second portion of a clock cycle that utilizes an evaluation path that is not clocked.

An amplified latch is provided that may include a clocked sense amplifier having an evaluation path that is not clocked and two substantially matched current sources, the amplifier having an output and a latch having an input connected to the output of the clocked sense amplifier.

These as well as still further features, objects and benefits of the invention will now become clear from consideration of the following detailed description of illustrative embodiments, taken in conjunction with the attached drawings.

BRIEF DESCRIPTION OF DRAWINGS

FIG. 1 is a schematic of a prior art conventional voltage-mode sense-amplifier (CVSA).

FIGS. 2(a) and (b) are schematics of prior art cross-couple SA designs, FIG. 2(a) using pMOS cross-coupled transistors and FIG. 2(b) using nMOS cross-coupled transistors.

FIG. 10 is a block diagram of a sense amplifier and latch combination made in accordance with the invention and configured to provide a low power, low noise, quantizer optical receiver.

DETAILED DESCRIPTION OF ILLUSTRATIVE EMBODIMENTS

FIG. 1 is a schematic of a prior art conventional voltage-mode sense-amplifier (CVSA) and has been discussed above in the Description of Related Art.

FIGS. 2(a) and (b) are schematics of prior art cross-couple SA designs, FIG. 2(a) using pMOS cross-coupled transistors and FIG. 2(b) using nMOS cross-coupled transistors. These figures have also been discussed above in the Description of Related Art.

Figure 3:
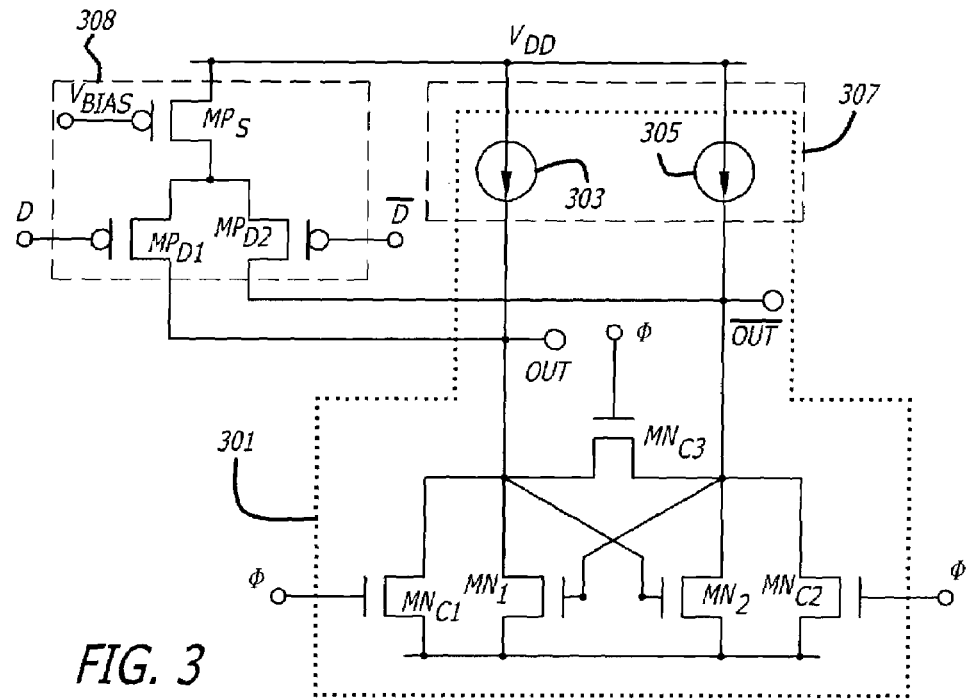
FIG. 3 is a schematic of one embodiment of the invention in which certain sections are represented by functional blocks, rather than specific components.

FIG. 3 is a schematic of one embodiment of the invention in which certain sections are represented by functional blocks, rather than specific components.

As shown in FIG. 3, the clocked evaluation path 104 in FIG. 1 and 201a and 201b in FIG. 2 is replaced with a current mode core 301 that includes an evaluation path, namely the drain to the source of transistor $MN_1$ for the output labeled OUT and the drain to source of transistor $MN_2$ for the output labeled $\overline{OUT}$ in FIG. 3, that is not clocked and that includes two substantially-matched current sources 303 and 305 in an area of the circuit 307.

The current mode core 301 also includes nMOS cross-coupled transistors $MN_1$ and $MN_2$ for positive feedback, and an input differential transconductance stage 308 for converting the input voltage to current. Although a particular type of differential transconductance stage is shown in the figure, it is, of course, to be understood that any other type could instead be used in other embodiments.

As is well understood by those skilled in the art, the nomenclature $V_{BIAS}$ is a reference to a bias voltage source and the subscript "S" as part of a transistor designation indicates that the transistor is processing the bias voltage. This same nomenclature applies to all of the figures in which this nomenclature appears.

Removal of the clock transistor from the evaluation chain 307 reduces the clock-load, improves the evaluation chain turn-on delay, and improves sense amplifier noise and threshold variation tolerance.

Figure 4:
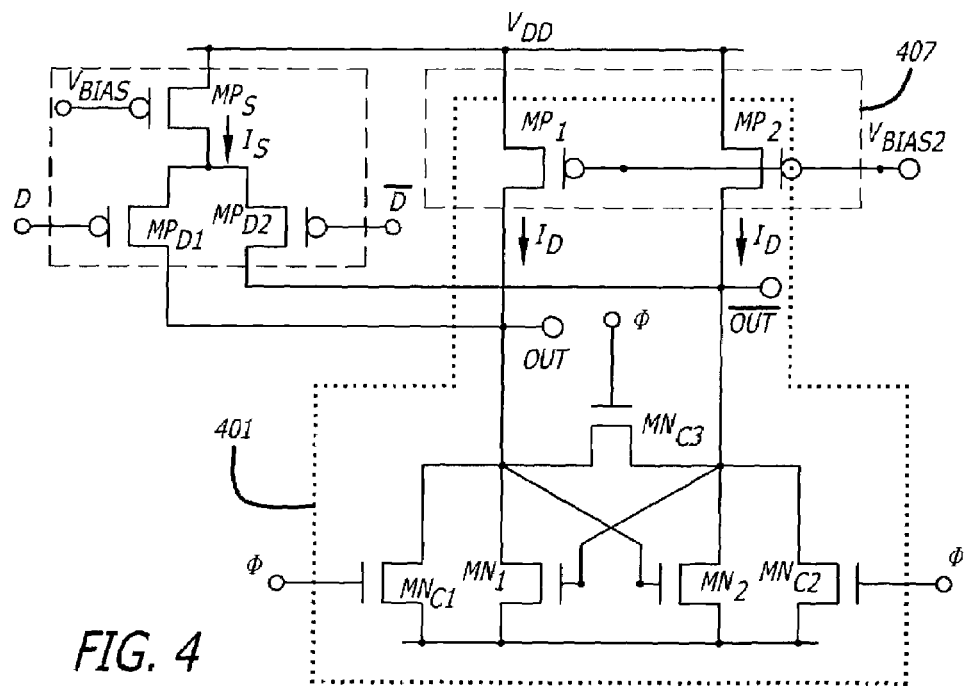
FIG. 4 is a schematic of one implementation of the embodiment of the invention shown in FIG. 3.

FIG. 4 is a schematic of one implementation of the embodiment of the invention shown in FIG. 3. To further reduce the clock-load and SA output parasitic capacitance due to clocked transistors, the PMOS precharge of the prior art CVSA shown in FIG. 1 is replaced with NMOS predischarge transistors $MN_{C1}$ and $MN_{C2}$, and the evaluation chain is transistor $MN_1$ for the output labeled OUT and $MN_2$ for the output labeled $\overline{OUT}$ in FIG. 4. The improvement in the turn-on delay from static current sources $MP_1$ and $MP_2$, the reduction in the evaluation chain depth, and the reduced clock transistor parasitic allows the PMOS current source transistors $MP_1$ and $MP_2$ to be sized comparable to those of the CVSA cross-couple NMOS transistors $MN_3$ and $MN_4$ in FIG. 1, without impacting the evaluation delay.

When clock signal ϕ is high in FIG. 4, both OUT and $\overline{OUT}$ are predischarged to ground. At the falling edge of ϕ, if D is low ($V_{(D-\overline{D})}=\Delta V_{VIN}<0$), $I_D+(\frac{1}{2}I_S+\Delta I)$ current flows through transistor $MN_{C1}$ and $I_D+(\frac{1}{2}IS-\Delta I)$ current flows through $MN_{C2}$. As a result of the current disparity, OUT changes from 0 to 1, while $\overline{OUT}$ remains at ground. When optimizing for higher frequencies, current $I_D$ is selected so that at the target frequency, transistors $MP_1$ and $MP_2$ are always in saturation ($V_{OUT}<V_{BIAS}+|V_{thP}|$, where $V_{thP}$ is the threshold voltage of the pMOS).

To improve the turn-on time of the evaluation transistors $MN_1$ and $MN_2$ and to reduce the clock-load, the predischarge transistor $MN_{C1}$ and $MN_{C2}$ width is selected so that during the predischarge phase the outputs remain just below $V_{thN}$. The transistor $MN_{C3}$ is used for equalization of the output nodes during predischarge. In 0.13 μm CMOS technology, the CSESA with 50 $mV_{PP}$ input sensitivity has a power consumption of 500 μW, a clock-load of 4.5 fF and an operating frequency of 5.0 GHz for a 3 times inverter load. On the other hand, a conventional SA with the same input sensitivity has an operating frequency of only 4.0 GHz, and a clock-load of 29.3 fF for a 3 times inverter load.

A brief performance comparison of the two sense amplifier architectures is given in Table 2. Table 2 compares the Hspice simulated performance of the invention with the best achievable speed that applicant has been able to obtain for the prior art CVSA, nCCSA and CSESA. The SAs are optimized for a fan-out of 3 (3 times minimum size inverter).

TABLE 2

| TSMC 0.13 μm CMOS | CVSA | nCCSA | Invention | Units |
|---|---|---|---|---|
| Power supply | 1.2 | 1.2 | 1.2 | Volts |
| Speed | 4.0 | 4.4 | 5.0 | GHz |
| Clock-load | 29.3 | 18 | 4.5 | fF |
| Power consumption (RMS) | 0.44 | 0.36 | 0.5 | mW |
| Power supply noise peak-peak (Vdd) | 1.4 | 0.8 | 0.12 | mA |

Figure 5A:
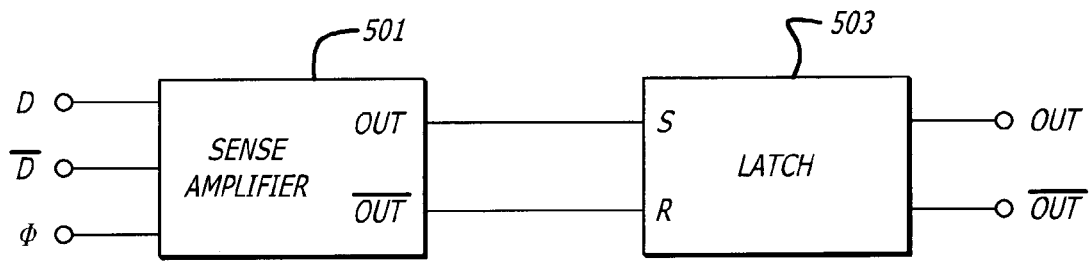
FIGS. 5(a)–(c) are block diagram of sense amplifier and latch circuits made in accordance with the invention being used in connection with latch circuits.
Figure 5B:
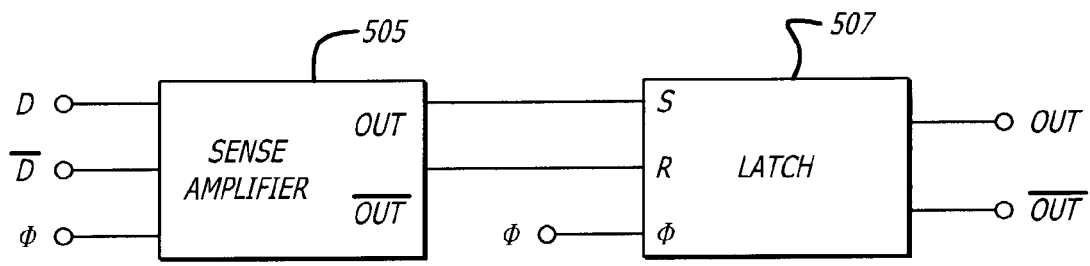
Figure 5C:
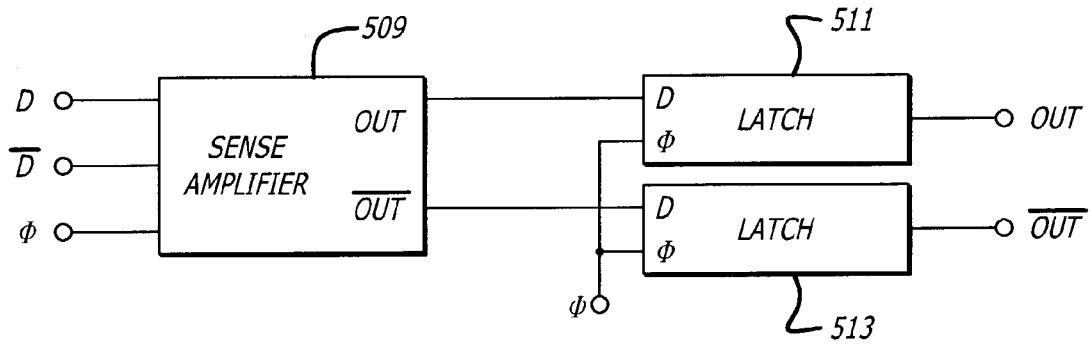

FIGS. 5(a)–(c) are block diagrams illustrating sense amplifiers 501, 505 and 509 made in accordance with the invention being used in connection with latch circuit 503, 507, 511 and 513, respectively.

As illustrated in FIG. 5(a), the complementary outputs of the sense amplifier 501 is connected to the set and reset inputs of the latch 503 which, in this instance, is a set-reset latch. The combination collectively constitutes a current-steering latch.

As illustrated in FIG. 5(b), the complementary outputs of the sense amplifier 505 is connected to the set and reset inputs of the latch 507 which, in this example, is a clocked set-reset latch. This collectively creates a current-steering dynamic latch.

FIG. 5(c) illustrates an alternate embodiment of the current-steering dynamic latch in which the complementary outputs of the sense amplifier 509 are each connected to the D input of latches 511 and 513 which, in this example, are clocked D memories.

Figure 6:
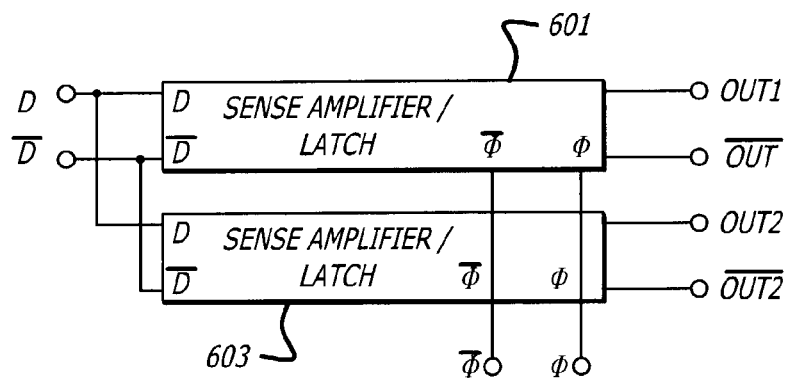
FIG. 6 is a block diagram of sense amplifier and latch circuits made in accordance with the invention being cross-coupled to create a de-multiplexer.

FIG. 6 is a block diagram of sense amplifier and latch circuits made in accordance with the invention being cross-coupled to create a de-multiplexer. Two clocked sense amplifiers/latch combinations 601 and 603 made in accordance with the invention, such as the combinations shown in FIG. 5(b) or (c), are connected in parallel to the D and $\overline{D}$ input, creating a de-multiplexer of a multiplex D signal. The de-multiplexing occurs during the different phases of the clock ϕ signal.

Figure 7:
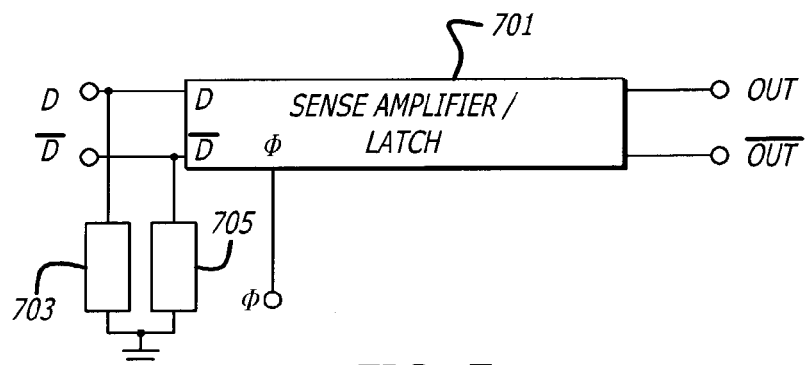
FIG. 7 is a block diagram of a sense amplifier and latch circuit made in accordance with the invention and configured to implement a high-speed receiver.

FIG. 7 is a block diagram of a sense amplifier and latch circuit made in accordance with the invention and configured to implement a high-speed receiver, such as an LVD or CMC. As shown in FIG. 7, a clocked sense amplifier/latch combination 701 made in accordance with the invention, such as the combination shown in FIGS. 5(b) or (c), has resistors 703 and 705 connected to the D and $\overline{D}$ inputs, respectively, thus acting as termination resistors.

Figure 8:
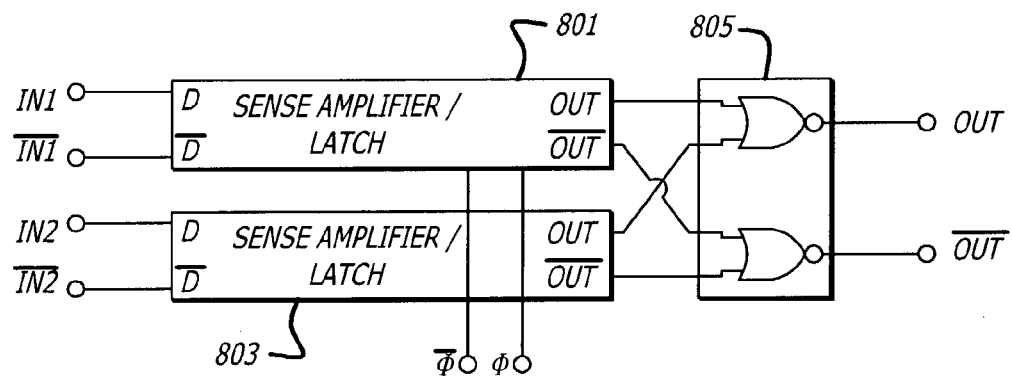
FIG. 8 is a block diagram of two sense amplifier and latch circuits made in accordance with the invention configured to implement a multiplexer.

FIG. 8 is a block diagram of two sense amplifier and latch circuits made in accordance with the invention configured to implement a multiplexer. As shown in FIG. 8, two clocked sense amplifier/latch combinations 801 and 803 made in accordance with the invention, such as the combination shown in FIG. 5(b) or (c), are connected to a combiner block 805 that may include NOR gates.

Figure 9:
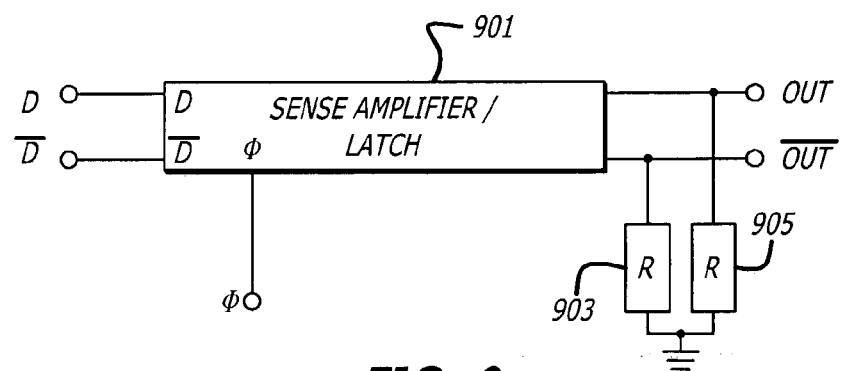
FIG. 9 is a block diagram of a sense amplifier and latch circuit made in accordance with the invention and configured to reduce power supply noise.

FIG. 9 is a block diagram of a sense amplifier and latch circuit made in accordance with the invention and configured to reduce power supply noise. As shown in FIG. 9, a sense amplifier/latch combination 901 made in accordance with the invention, such as the combination shown in FIG. 5(b) or (c), has resistors 903 and 905 connected to the OUT and $\overline{OUT}$ outputs, respectively, thus acting as termination resistors.

FIG. 10 is a block diagram of a sense amplifier and latch combination made in accordance with the invention and configured to provide a low power, low noise, quantizer optical receiver. As shown in FIG. 10, a sense amplifier and latch combination 1001 made in accordance with the invention, such as the combination shown in FIG. 5(b) or (c), has its inputs connected to an optical receiver 1003 driven by a photodiode 1005.

As should now be apparent to those skilled in the art, the embodiments that have now been discussed are merely illustrative. The invention has wide applicability to numerous applications and configurations in numerous forms.

For example, the invention is useful in deep sub-micron designs, such as 0.18 μm technology and 0.13 μm technology, and is useful in other size technologies as well.

Figure 11:
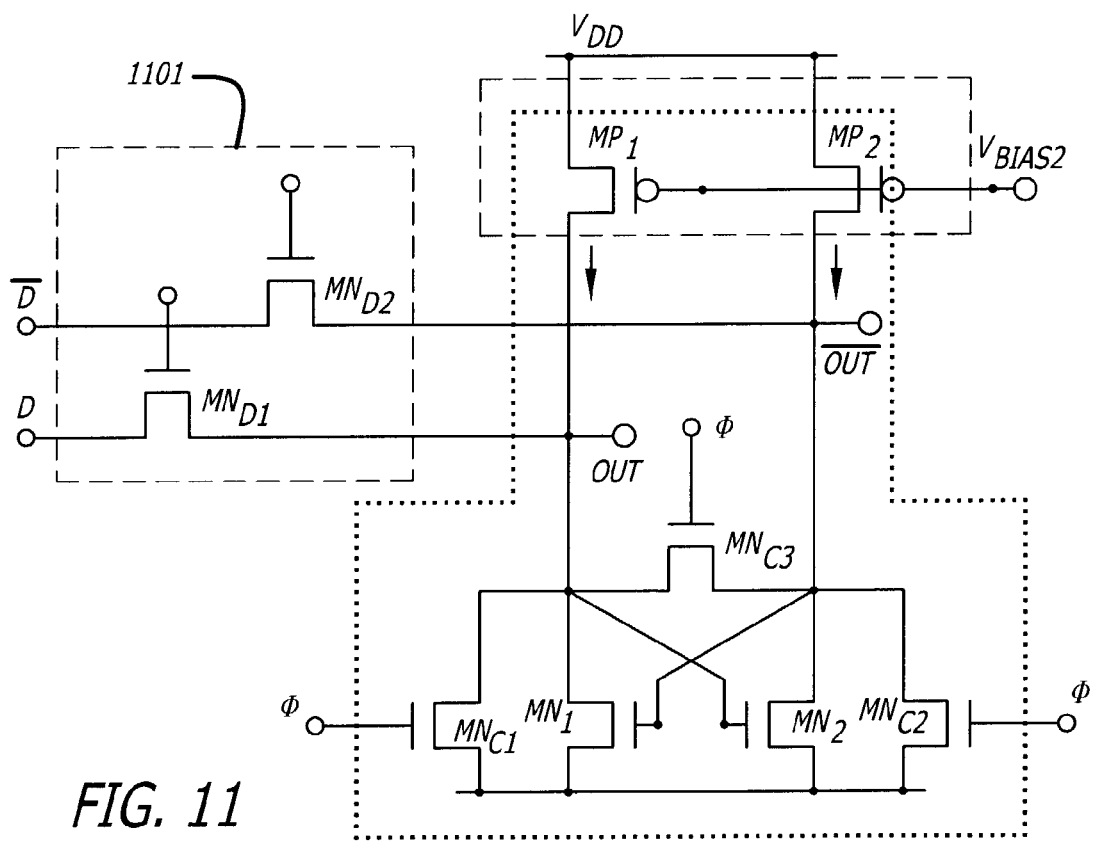
FIG. 11 illustrates another embodiment of the invention using an input pass-transistor stage.

FIG. 11 illustrates but another embodiment of the invention using an input pass-transistor stage. As shown in FIG. 11, an input pass-transistor stage 1101 receives the D and $\overline{D}$ data inputs. The other portions of the circuit are the same and operate in substantially the same way as the embodiment of the invention shown in FIG. 4 and discussed above in connection with FIG. 4.

In short, the invention is limited solely by the claims that now follow.

We claim:

1. A clocked sense amplifier having a differential input stage connected to a current mode core that:
    includes two substantially matched current sources;
    includes at least one evaluation path consisting of a single transistor; and that
    is configured to have current flowing through the current mode core at all times during the operation of the clocked sense amplifier so as to minimize the turn-on time of the evaluation path in the current mode core,
    whereby the clocked sense amplifier is configured to have a pre-charge or pre-discharge phase followed by an evaluation phase.

2. The clocked sense amplifier of claim 1, with:
    a differential transconductance or differential current input stage; and
    said current mode core contains said at least one evaluation path and is connected to the differential transconductance or differential current input stage said in claim 1 in such a manner that the current mode core has current flowing through it at all times independent of the differential transconductance or differential current input stage.

* * * * *